(12) United States Patent
Chakraborty et al.

(10) Patent No.: US 11,574,228 B2
(45) Date of Patent: Feb. 7, 2023

(54) LOW POWER QUANTUM CONTROLLER

(71) Applicant: INTERNATIONAL BUSINESS MACHINES CORPORATION, Armonk, NY (US)

(72) Inventors: Sudipto Chakraborty, Yorktown Heights, NY (US); Rajiv Joshi, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 389 days.

(21) Appl. No.: 16/865,332

(22) Filed: May 2, 2020

(65) Prior Publication Data

US 2021/0342726 A1 Nov. 4, 2021

(51) Int. Cl.
*G06N 10/00* (2022.01)
*G06F 15/80* (2006.01)
*H03K 19/195* (2006.01)
*G06F 1/20* (2006.01)

(52) U.S. Cl.
CPC .............. *G06N 10/00* (2019.01); *G06F 1/206* (2013.01); *G06F 15/80* (2013.01); *H03K 19/195* (2013.01)

(58) Field of Classification Search
CPC ......... G06F 1/206; G06F 15/80; G06N 10/00; H03K 19/195
See application file for complete search history.

(56) References Cited

U.S. PATENT DOCUMENTS

| | | | |
|---|---|---|---|
| 8,260,144 B2 | 9/2012 | Gupta et al. | |
| 8,503,546 B1 | 8/2013 | Ashrafi | |
| 8,571,614 B1 | 10/2013 | Mukhanov et al. | |
| 8,604,958 B2 * | 12/2013 | Pfann | H03M 1/66 375/295 |
| 8,786,476 B2 | 7/2014 | Bunyk et al. | |

(Continued)

FOREIGN PATENT DOCUMENTS

EP  3 300 004 A1  3/2018
EP  3266063 B1  3/2020

OTHER PUBLICATIONS

List of IBM Patents or Patent Applications Treated as Related (2 pgs.).

(Continued)

*Primary Examiner* — Kurtis R Bahr
(74) *Attorney, Agent, or Firm* — Intelletek Law Group, PLLC; Gabriel Daniel, Esq.

(57) ABSTRACT

A quantum write controller includes an in-phase path that includes a first digital to analog converter (DAC) configured to receive an in-phase signal at a first frequency, a first mixer configured to create a third in phase frequency, a first combiner configured to combine an output of the first mixer with an output of a third mixer, and a second mixer configured to mix an output of the first combiner with a fourth in phase frequency. There is a quadrature path that includes a second DAC configured to receive a quadrature phase signal at the first frequency, a third mixer configured to create a third quadrature frequency, a second combiner configured to combine the output of the third mixer with the output of the first mixer, and a fourth mixer configured to mix an output of the second combiner with a fourth quadrature frequency.

20 Claims, 8 Drawing Sheets

(56) References Cited

U.S. PATENT DOCUMENTS

| | | | |
|---|---|---|---|
| 9,331,875 B2 | 5/2016 | Ashrafi | |
| 9,509,274 B2 | 11/2016 | Naaman et al. | |
| 9,853,645 B1 | 12/2017 | Mukhanov et al. | |
| 9,960,883 B1 * | 5/2018 | Chakraborty | H03D 7/165 |
| 10,192,168 B2 | 1/2019 | Rigetti et al. | |
| 10,621,503 B1 | 4/2020 | Mueller et al. | |
| 10,769,546 B1 | 9/2020 | Rigetti et al. | |
| 10,817,463 B1 | 10/2020 | DeBenedictis | |
| 11,018,840 B2 * | 5/2021 | Montalvo | H04B 1/0057 |
| 2012/0328041 A1 | 12/2012 | Chen et al. | |
| 2016/0267032 A1 | 9/2016 | Rigetti et al. | |
| 2017/0026095 A1 | 1/2017 | Ashrafi et al. | |
| 2017/0346510 A1 | 11/2017 | Chen et al. | |
| 2018/0013426 A1 | 8/2018 | Deurloo et al. | |
| 2018/0302111 A1 | 10/2018 | Chen et al. | |
| 2019/0311296 A1 | 10/2019 | Fan et al. | |
| 2020/0250564 A1 | 8/2020 | Li et al. | |

OTHER PUBLICATIONS

Hornibrook, J.M. et al., "Cryogenic Control Architecture for Large-Scale Quantum Computing"; arXiv:1409.2202v1 [cond-mat.meshall] (2014); 8 pgs.

Bronn, N.T., et al., "Fast, High-Fidelity Readout of Multiple Qubits"; Journal of Physics: Conf. (2017); Ser. 834; 11 pgs.

Van Dijk, J.P.G., et al., "Impact of Classical Control Electronics on Qubit Fidelity"; Physical Review Applied (2019); vol. 12; 20 pgs.

Geck, L. et al., "Control Electronics for Semiconductor Spin Qubits"; Quantum Sci. Technol. (2020), vol. 5; 19 pgs.

Salathe, Y., "Low-Latency Digital Signal Processing for Feedback and Feedforward in Quantum Computing and Communication"; arXiv:1709.01030v1 [quant-ph] (2017); 20 pgs.

Skach, C. et al., "How New DAC Technologies are Changing Signal Generation For Test" Electronic Design (2017); 14 pgs.

Guibord, M. "Digital-to-Analog Converter (DAC) Output Response"; Texas Instruments (2017); 23 pgs.

Tektronix, "Overcoming RF Signal Generation Challenges in Quantum Computing with New DAC Technologies" White Paper; www.Tek.com (2017); 12 pgs.

Mastriani, M. et al., "Quantum Spectral Analysis: Frequency in Time, with Applications to Signal and Image Processing"; Quantum Communications Lab, Qubit Reset LLC (2016); 140 pgs (Part 1, 70 pgs).

Mastriani, M. et al., "Quantum Spectral Analysis: Frequency in Time, with Applications to Signal and Image Processing"; Quantum Communications Lab, Qubit Reset LLC (2016); 140 pgs (Part 2, 70 pgs).

Ding, Y et al., "Systematic Crosstalk Mitigation for Superconducting Qubits via Frequency-Aware Compilation"; 53rd Annual IEEE/ACM International Symposium on Microarchitecture (2020); 14 pgs.

Helmer, F et al., "Cavity Grid for Scalable Quantume Computation with Superconducting Circuits"; EPL : A Letters Journal Exploring the Frontiers of Physics (2009); vol. 85:5, 6 pgs.

Versluis, R et al., "Scalable Quantum Circuit and Control for a Superconducting Surface Code"; ARXIV.org, Cornell University Library (2016); retrieved Jul. 14, 2021; 10 pgs.

International Search Report and Written Opinion issued Jul. 29, 2021 in related application No. PCT/EP2021/059518, 14 pgs.

Barends, R. et al., "Supplementary Information for Superconducting Quantum Circuits at the Surface Code Threshold for Fault Tolerance"; Nature (2014); vol. 508:7497, 12 pgs.

Bishnu, P. et al., "Cryo-CMOS Circuits and Systems for Quantum Computing Applications"; IEEE Journal of Solid-State Circuits (2018); vol. 53:1, pp. 309-321.

Reilly, D. J. et al., "Engineering the Quantum-Classical Interface of Solid-State Qubits"; NPJ Quantum Information (2015); vol. 1:1; 10 pgs.

International Search Report and Written Opinion dated Jul. 23, 2021 in related application No. PCT/EP2021/059968, 15 pgs.

* cited by examiner

600 ↘

| First set | Vector Amplitude | 1X Phasors | 3X Phasors | 5X Phasors | 7X Phasors | 9X Phasors | 11X Phasors |
|---|---|---|---|---|---|---|---|
|  | 1 | 0 | 0 | 0 | 0 | 0 | 0 |
|  | 0.707 | 135 | 45 | 315 | 225 | 135 | 45 |
|  | 0.707 | 225 | 315 | 45 | 135 | 225 | 315 |
|  |  |  |  |  |  |  |  |
| Result |  | Cancels | Adds | Adds | Cancels | Cancels | Cancels |

FIG. 6

LOW POWER QUANTUM CONTROLLER

BACKGROUND

Technical Field

The present disclosure generally relates to superconducting devices, and more particularly, scalable qubit architectures.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

SUMMARY

According to various embodiments, a method and system are provided for controlling a qubit. A quantum write controller includes an in-phase path that includes a first digital to analog converter (DAC) configured to receive an in-phase signal at a first frequency; a first mixer configured to mix an output of the first DAC with a second in phase frequency to create a third in phase frequency; a first combiner configured to combine an output of the first mixer with an output of a third mixer; and a second mixer configured to mix an output of the first combiner with a fourth in phase frequency. There is a quadrature path, that includes a second DAC configured to receive a quadrature phase signal at the first frequency; a third mixer configured to mix an output of the second DAC with a second quadrature frequency to create a third quadrature frequency; a second combiner configured to combine the output of the third mixer with the output of the first mixer; and a fourth mixer configured to mix an output of the second combiner with a fourth quadrature frequency. A third combiner is configured to combine an output of the second mixer with an output of the fourth mixer.

In one embodiment, a matching network is coupled to an output of the third combiner.

In one embodiment, the matching network is configured to provide a maximum power transfer to a corresponding qubit.

In one embodiment, the matching network is configured to filter out spurious signals introduced by at least one of the fourth in-phase frequency or the fourth quadrature frequency.

In one embodiment, the first combiner is configured to sum the output of the first mixer and the output of the third mixer.

In one embodiment, the second combiner is configured to subtract the output of the first mixer from the output of the third mixer.

In one embodiment, the quantum write controller is configured to operate at a cryogenic temperature in a dilution refrigerator.

In one embodiment, the first and second combiners are programmable.

In one embodiment, the quantum write controller further includes a first filter coupled between the output of the first combiner and an input of the second mixer and a second filter coupled between the output of the second combiner and an input of the fourth mixer. The first and second filters may be configured to remove spurious harmonic signals, introduced by the second in-phase frequency and the second quadrature frequency, which are away from a center frequency of a target qubit.

In one embodiment, the quantum write controller is part of a quantum write controller array. Each quantum write controller is configured to control a single corresponding qubit. The first DAC and the second DAC are shared among a group of qubits based on having a same signal amplitude but different center frequency.

In one embodiment, the first frequency is common in each quantum write controller in the quantum write controller array;

In one embodiment, the third in-phase frequency is different in each quantum write controller of the quantum write controller array. The third quadrature frequency is different in each quantum write controller of the quantum write controller array.

In one embodiment, the second in-phase frequency is common in each quantum write controller in the quantum write controller array. The second quadrature frequency is common in each quantum write controller in the quantum write controller array. The fourth in-phase frequency is common in each quantum write controller in the quantum write controller array. The fourth quadrature frequency is common in each quantum write controller in the quantum write controller array.

In one embodiment, the second in-phase frequency and the second quadrature frequency, and the fourth in phase frequency and the fourth quadrature frequency, are related to each other by an integer multiplier N.

According to one embodiment, a method of controlling a qubit with a controller having an in-phase path and a quadrature path is provided. An in-phase signal is received at a first frequency by a first digital to analog converter (DAC) in the in-phase path. An output of the first DAC is mixed with a second in phase frequency to create a third in phase frequency by a first mixer in the in-phase path. An output of the first mixer is combined with an output of a third mixer by a first combiner in the in-phase path. An output of the first combiner is mixed with a fourth in phase frequency by a second mixer. A quadrature phase signal is received at the first frequency by a second DAC in the quadrature path. An output of the second DAC is mixed with a second quadrature frequency to create a third quadrature frequency by a third mixer in the quadrature path. The output of the third mixer is combined with the output of the first mixer by a second combiner in the quadrature path. An output of the second combiner is mixed with a fourth quadrature frequency by a fourth mixer in the quadrature path. An output of the second mixer is combined with an output of the fourth mixer by a third combiner.

In one embodiment, a maximum power transfer to a corresponding qubit is provided by coupling a matching network to an output of the third combiner.

In one embodiment, the matching network filters out spurious signals introduced by at least one of the fourth in-phase frequency or the fourth quadrature frequency, by coupling a matching network to an output of the third combiner.

In one embodiment, the first combiner sums the output of the first mixer and the output of the third mixer. The second combiner subtracts the output of the first mixer from the output of the third mixer.

In one embodiment, a first filter is coupled between the output of the first combiner and an input of the second mixer. A second filter is coupled between the output of the second combiner and an input of the fourth mixer, wherein the first and second filters remove spurious harmonic signals introduced by the second in-phase frequency and the second quadrature frequency, which are away from a center frequency of the controlled qubit.

In one embodiment, the first frequency is applied to be common in each quantum write controller in a quantum write controller array. The third in-phase frequency is applied to be different in each quantum write controller in the quantum write controller array. The third quadrature frequency is applied to be different in each quantum write controller in the quantum write controller array. The second in-phase frequency is applied to be common in each quantum write controller in the quantum write controller array. The second quadrature frequency is applied to be common in each quantum write controller in the quantum write controller array. The fourth in-phase frequency is applied to be common in each quantum write controller in the quantum write controller array. The fourth quadrature frequency is applied to be common in each quantum write controller in the quantum write controller array.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 6 illustrates a phasor chart that explains phasor cancellation and additions, consistent with an illustrative embodiment.

DETAILED DESCRIPTION

Overview

Figure 1:
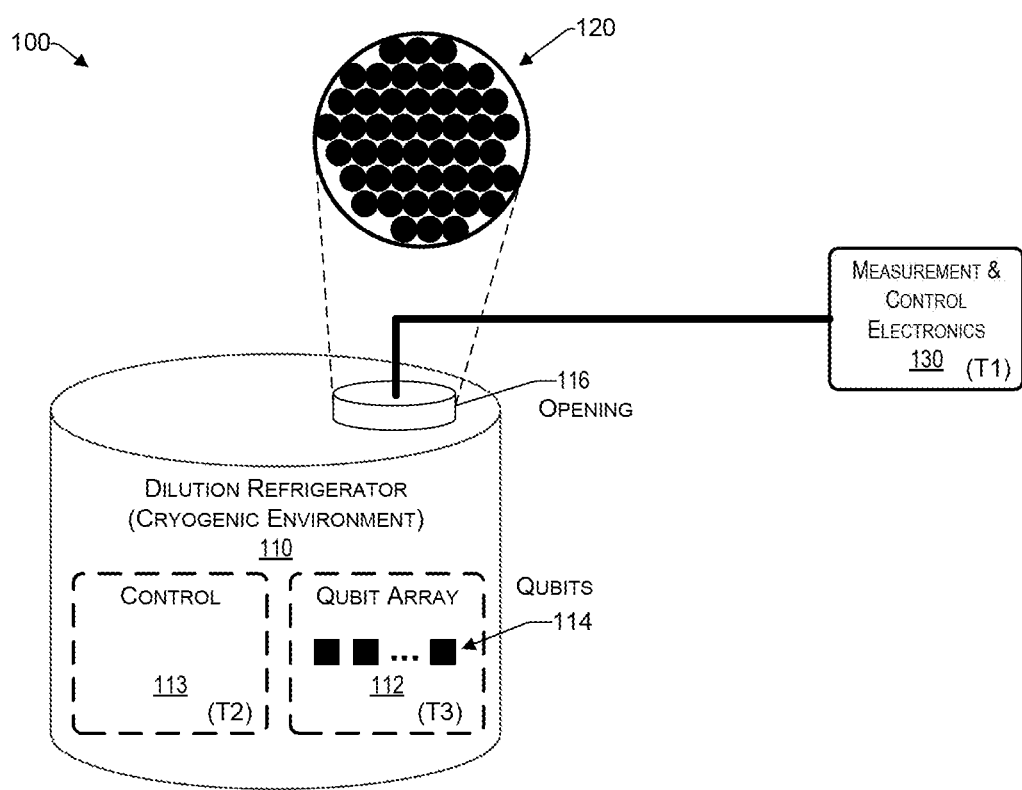
FIG. 1 illustrates an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, power efficient and scalable qubit architectures. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. For example, a qubit can be excited directly by an electrical waveform with a predetermined amplitude, phase, and frequency. The frequency of the exciting waveform may be the resonance frequency of the qubit, and the shape of the waveform could be gaussian or a set of derivatives thereof. Each qubit can also be excited by another qubit that is weakly coupled to is using capacitive mechanisms.

The transmitted (or reflected) microwave signal goes through multiple thermal isolation stages and low-noise amplifiers that are used to block or reduce the noise and improve the signal-to-noise ratio. Much of the process is performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The ability to include more qubits is salient to being able to realize the potential of quantum computers. Reduction of the temperature of the computing environment to cryogenic temperatures is used for the quantum processor to function. Generally, performance increases as temperature is lowered, for example by reducing the residual thermally-excited state qubit population and decreasing the thermal broadening of the qubit transition frequencies. Accordingly, the lower the temperature, the better for the performance of a quantum processor.

Applicants have recognized that to increase the computational power and reliability of a quantum computer, improvements can be made along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. Each of these qubits should be controlled by a corresponding quantum controller. In this way, the local information is delocalized such that the quantum computer is less susceptible to local errors and the performance of measurements in the qubits' eigenbasis, similar to parity checks of classical computers, thereby advancing to a more fault tolerant quantum bit.

Example Architecture

FIG. 1 illustrates an example architecture 100 of a quantum computing system, consistent with an illustrative embodiment. The architecture 100 includes a qubit array 112 comprising a plurality of qubits 114. The qubit array 112 is located in a refrigeration unit 110, which may be a dilution refrigerator. The refrigeration unit may also house a control circuit block 113, sometimes referred to herein as a second set of control electronics. For example, the control circuit block 113 may be configured to provide various functions, such as perform write and/or read operations to one or more qubits in the qubit array 112. The control block 113 is sometimes referred to herein as a quantum controller.

In one embodiment, the refrigeration unit 110 may have a plurality of chambers or regions, each having a different controlled temperature. For example, the control circuit block 113 may be at a controlled temperature that is 1K to 4K, whereas the qubit array 112 is at a controlled temperature of 240 mK or lower. A dilution refrigerator is a cryogenic device that provides continuous cooling to temperatures as low as 2 mK. Most of the physical volume of the architecture 100 is due to the large size of the refrigeration unit 110. The best performance for the qubits can be obtained at the lowest temperature. However, due to thermodynamic efficiency, a coldest temperature may not be readily achieved in one step from room temperature. In this regard, applicants have determined that operating ancillary electronics at 240 mK is energy inefficient and therefore not placed in the third controlled temperature environment (T2), but in a second controlled temperature environment (T2). The cooling materials/agents (e.g., liquid Nitrogen at 77K, Liquid He for 4K and lower) used in each of these temperature ranges may also be different.

To reach the near-absolute zero temperatures at which the system operates, the refrigeration unit 110 may us liquid helium as a coolant. For example, a "dry" refrigeration unit may operate with two gaseous closed-cycle: one of He-4 that takes the fridge down to 3K (the "pulse tube" cycle) and another of He-3/He-4 mixture that takes the fridge down to 10 mK, or the lowest temperature (the "dilution" cycle). The only liquid in the system is inside the fridge, where the He-3/He-4 mixture condenses.

There is a measurement and control unit 130, sometimes referred to herein as the first set of control electronics, that is outside of the refrigeration unit 110. For example, the measurement and control unit 130 may operate at room temperature. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. A practical challenge in known refrigeration devices that house qubits 114 is that the number of qubits that can be accommodated in the refrigeration unit is limited due the number of wires between the measurement and control unit 130 and the qubits 114 measured thereby.

Figure 2A:
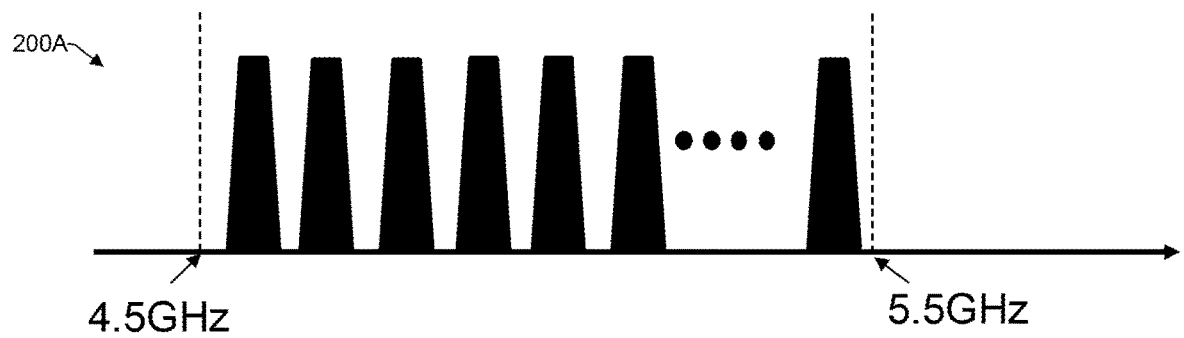
FIG. 2A illustrates example waveforms of a conventional approach in communicating with qubits.

Reference now is made to FIG. 2A, which illustrates example waveforms 200A of a conventional approach in communicating with qubits. Each trapezoid represents the signal to be provided to the qubit, and comprises a bandwidth representing the information content of the waveform, with the center representing the center frequency of the qubit, which may lie between 4.5 GHz and 5.5 GHz in the example of FIG. 2A. Thus, there is a wide range in resonant frequencies for different qubits. In today's technology, the center frequency Fc of a qubit may not be precisely known. Qubit technology is still at its infancy and developing a qubit having a predetermined frequency with high precision is a challenge. For example, in some scenarios, a consistent fabrication of a qubit to have a 5.20 GHz center frequency, may not be repeatedly achieved.

There typically is a center frequency, such as 5 GHz, and frequency offset is achieved in the digital domain, where the center frequency offset (e.g., difference between the midpoint of the trapezoid), as well as the information content of the signal (e.g., the width of the trapezoid) is combined (e.g., two waveforms multiplied) to provide the requisite center frequencies of each qubit. High power consumption results from the fact that the frequency offset leads to a higher frequency content to be digitized. In principle, digitization is more power consuming compared to less digitization and mixing thereafter, as discussed in the context of FIG. 5B below.

Figure 2B:
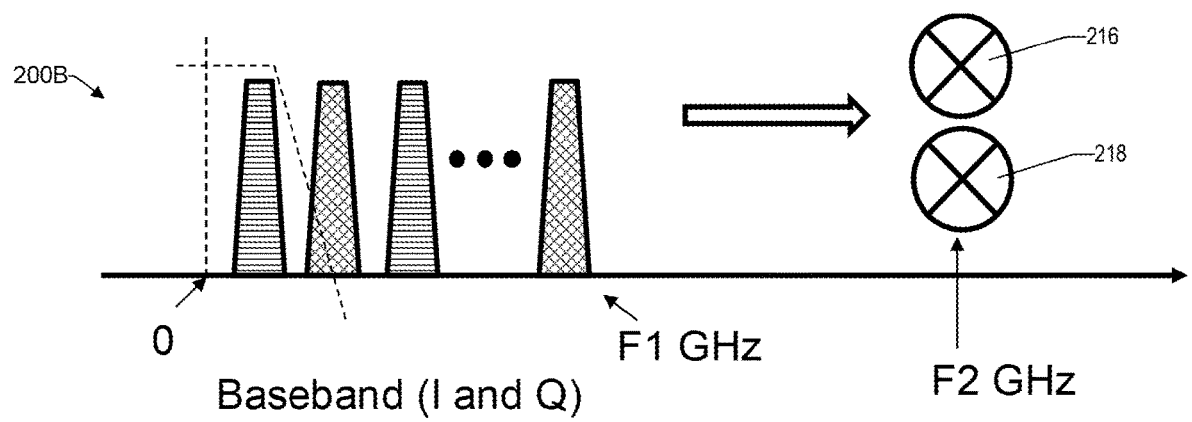
FIG. 2B illustrates a more efficient approach of communicating with a qubit, consistent with an illustrative embodiment.
Figures 5A, 5B:
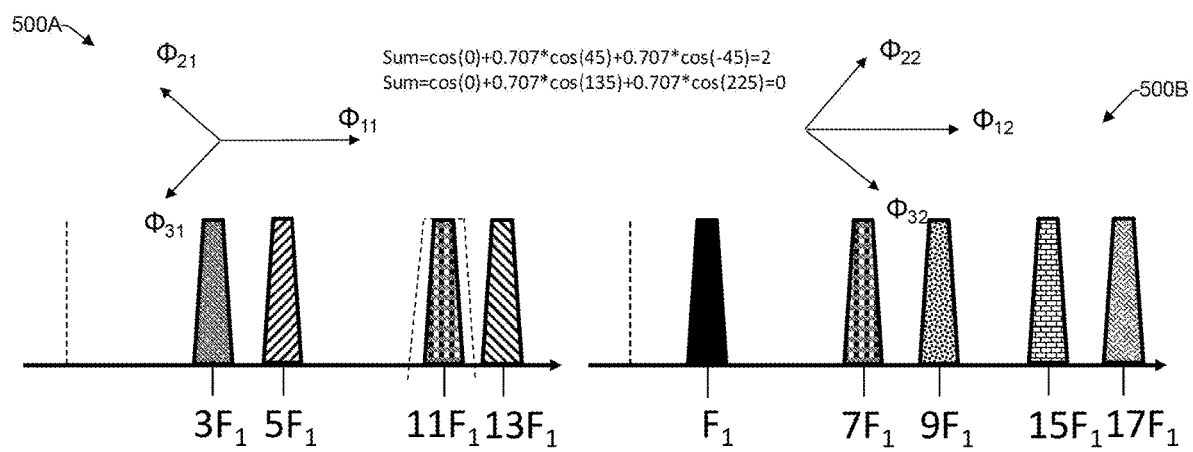
FIGS. 5A and 5B illustrate a frequency domain of multiphase operation harmonic phasor cancellation, consistent with illustrative embodiments.

In contrast, FIG. 5B illustrates a more power efficient approach 200B of communicating with a qubit, consistent with an illustrative embodiment. In one embodiment, each qubit can be measured to determine what frequency can be used to excite it (e.g. 5.27 GHz). This determination can be used to logically group the qubits as described in more detail later. In other scenarios, where the center frequency of a qubit is more readily controlled during fabrication, the qubits can be physically grouped as described herein. In the example of FIG. 2B, each different pattern in the trapezoid, represents a different center frequency of a corresponding qubit. After the information is generated in the baseband domain, the upconverter components 216 and 218 translate that information to the targeted qubit frequency. The information content of the trapezoid remains the same, and it is shifted in frequency.

Once the center frequency of each qubit of a qubit array is determined, the qubit array is divided into different groups, where each group comprises a most diverse set of center frequencies of qubits. In this way, signals can be provided to each qubit with better fidelity and less interference. For example, an array of 16 qubits may include 4 qubits having a center frequency of 4 GHz, 4 qubits having a center frequency of 5.5 GHz, 4 qubits having a center frequency of 6 GHz, and 4 qubits having a center frequency of 7 GHz. The qubit array of 16 may be divided into groups of 4, each having a qubit having a center frequency of 4 GHz, 5.5 GHz, 6 GHz, and 7 GHz. In this way, the interference between the qubits is substantially reduced. In various embodiments the grouping discussed herein can be (i) a logical grouping (based on a determination of each center frequency of a qubit in an array, while the qubits are in various locations of a chip) or (ii) a physical grouping, where qubits are specifically configured to have a predetermined center frequency and placed based on their center frequencies, as discussed in more detail later. The latter approach becomes increasingly more salient as qubit fabrication technology improves. The logical grouping can be performed by superconducting cables.

In one embodiment, the teachings herein support a single sideband (SSB) mixing and targets lower sideband (LSB) as well as upper sideband (USB).

Example Block Diagram(s)

Figure 3:
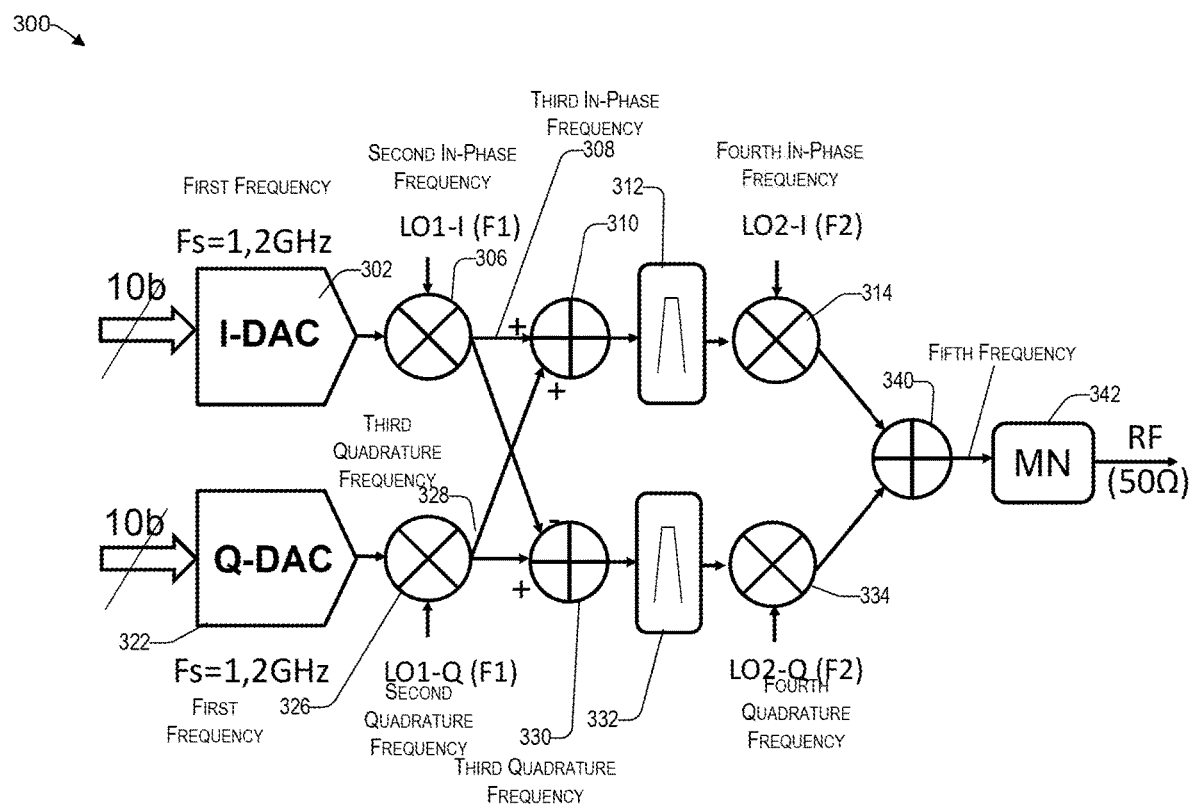
FIG. 3 is a block diagram of a single channel of a quantum controller, consistent with an illustrative embodiment.

FIG. 3 is a block diagram of a single channel of a quantum controller 300, consistent with an illustrative embodiment. The quantum controller 300 includes two paths, namely (i) an in-phase path (I), and (ii) a quadrature path (Q), which are mutually similar. Each of these paths will be discussed in detail below, while certain features will be not repeated for the second path for brevity.

The in-phase path includes a first digital to analog converter (DAC) 302 configured to receive an in-phase signal at a first frequency FS, sometimes referred to herein as a sampling frequency. For example, the sampling frequency may be 1 GHz, 2, GHz, etc. In the example of FIG. 3, the in-phase input signal is 10-bit and the first DAC 302 is a 10-bit DAC, while it will be understood that any other number of bits may be used, based on the desired resolution. The first path includes a first mixer 306 configured to mix an output of the first DAC 302 with a second in-phase frequency (LO1-I), sometimes referred to herein as F1, to create a third in-phase frequency at its output 308.

The in-phase path includes a first combiner 310 configured to combine the output 308 of the first mixer 306 with an output 328 of a third mixer 326. In one embodiment, the first combiner 310 sums the outputs of the first mixer 306 and the third mixer 326.

In one embodiment, the in-phase path includes a first filter 312 coupled to an output of the first combiner 310. There is a second mixer 314 configured to mix an output of the first filter 312 with a fourth in-phase frequency that is in phase (L02-I).

As explained above, the quadrature path Q is substantially similar to the in-phase path I. It includes a second DAC 322 configured to receive a quadrature signal at the first frequency. There is a third mixer 326 configured to mix an output of the second DAC 322 with a first quadrature frequency (LO1-Q) to create a third quadrature frequency. There is a second combiner 330 configured to combine the output 328 of the third mixer 326 with the output 308 of the first mixer 306. In one embodiment the second combiner 330 subtracts the signal at the output 308 of the first mixer 306 from the output 328 of the third mixer 326.

In one embodiment, there is a second filter 332 coupled to an output of the second combiner 330. Each of the first and second filters 312, 332 remove spurious signals that are away from the desired center frequency. Accordingly, undesired harmonics of the first reference in phase frequency and first reference quadrature frequency can be suppressed by filters 312 and 332, respectively. There is a fourth mixer 334 configured to mix an output of the second filter 332 with a second reference quadrature frequency (L02-Q).

The signals of the in-phase path and the quadrature path are combined by a third combiner 340. Stated differently, the third combiner 340 is configured to combine an output of the second mixer 314 with an output of the fourth mixer 334. There may be a matching network 342 coupled to an output of the third combiner. The matching network 342 provides maximum power transfer to the corresponding qubit and also provides filtration of any spurious signals that may have been introduced by the fourth in-phase frequency LO2-I and the fourth quadrature frequency LO2-Q. The channel of the quantum controller 300 may have single corresponding qubit. In one embodiment, the first and second DACs are shared among a group of qubits based on having a same signal amplitude but different center frequency.

Figure 4:
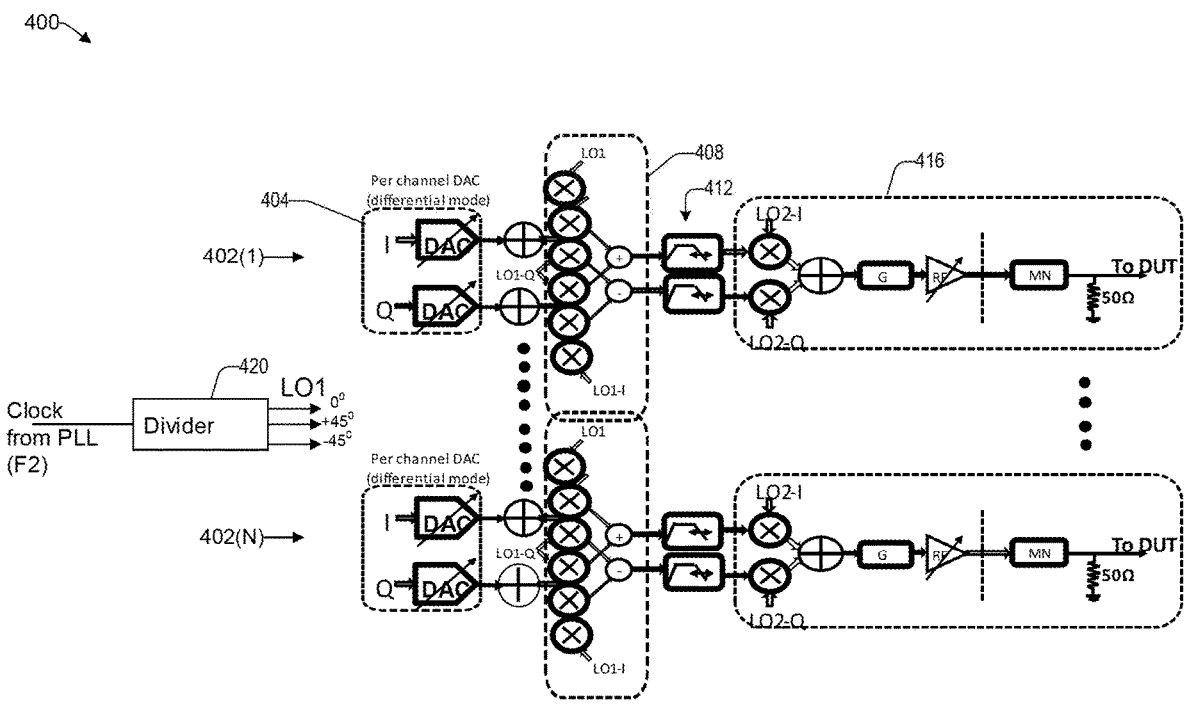
FIG. 4 illustrates a conceptual block diagram of an array of quantum controllers, consistent with an embodiment of the present disclosure.

With the foregoing description of a block diagram of a single channel of a quantum controller 300, it may be helpful to provide a more high-level view of a system of write controllers. In this regard, FIG. 4 illustrates a conceptual block diagram 400 of an array of quantum controllers, consistent with an embodiment of the present disclosure. FIG. 4 includes a plurality of quantum controllers (402(1) to 402(N)), where N represents the number of qubits. Stated differently, in one embodiment, each qubit includes its corresponding write controller.

In the example of FIG. 4, each channel (e.g., quantum controller 402(1) to 402(N)) targets a unique qubit frequency. Each quantum controller (e.g., 402(1)) includes a DAC stage 404 for both in-phase and quadrature signals. There is a mixer stage 408 having a first set of mixers that provide a sum of the first frequency and the first reference in phase frequency to create an in-phase third frequency signal. Further, the mixer stage 408 also includes a second set of mixers that provide a difference between the first frequency and the second quadrature frequency to create a quadrature third frequency signal. The filtration stage 412 includes a first filter that filters the in-phase third frequency, and a second filter that filters the quadrature third frequency. These filtered signals are then provided to second mixer stage 416.

As illustrated in FIG. 4, there is a divider 420 configured to receive a reference clock, which may be from a phased locked loop (PLL) or a delay locked loop (DLL). The divider 420 uses the received clock signal and generates three output signals at 0 degrees, +45 degrees, and −45 degrees, from which a first set of reference signals that are both in-phase and quadrature, sometimes referred to herein as LO1-I and LO1-Q, are generated. The signals generated by the divider 420 are common to each of the multiple quantum controllers 402(1) to 402(N). Thus, while the first frequency is common to all channels (i.e., of quantum controllers in an array of quantum controllers), the generated third in phase frequency is different for each channel (i.e., quantum controller).

Referring back to FIG. 3, in one embodiment, the second in-phase frequency LO1-I and the second quadrature frequency LO1-Q, collectively referred to herein as F1, and the fourth in phase frequency LO2-I and the fourth quadrature frequency L02-Q, collectively referred to herein as F2, are related to each other by an integer multiplier (e.g., F1=F2/N, where N is an integer). The F1 and F2 frequencies are common in an array of quantum controllers. By virtue of being able to sum and subtract the different frequencies, the frequency range can be dynamically adjusted by a factor of up to 2X. In this way, a different frequency can be generated for each different qubit.

Weighted vector combiner from multiple phases of F1 creates a near sinusoidal waveshape. This can be established by using common trigonometric equations. First, a set of M phases are generated using a frequency divider or other phase processing network. Then, N phases are used to perform a null vector sum at certain harmonics of the waveform to suppress harmonic energy at these harmonics. As many harmonic frequency components are suppressed, the waveshape approaches to a sinusoidal shape. The following equations are given at some of the harmonics:

Fundamental Frequency:

$$\text{Sqrt}(2)*\cos(2\pi f_1 t+\varphi_{ref})+\cos(2\pi f_1 t+\varphi_{ref}+\varphi)+\cos(2\pi f_1 t+\varphi_{ref}-\varphi)=\text{Fundamental component (constructive addition at fundamental frequency)} \quad (\text{Eq. 1})$$

$$\text{Sqrt}(2)*\cos(6\pi f_1 t+3\varphi_{ref})+\cos(6\pi f_1 t+3\varphi_{ref}+3\varphi)+\cos(6\pi f_1 t+3\varphi_{ref}-3\varphi)=3^{rd} \text{ harmonic component (cancellation at third harmonic)} \quad (\text{Eq. 2})$$

$$\text{Sqrt}(2)*\cos(10\pi f_1 t+5\varphi_{ref})+\cos(10\pi f_1 t+5\varphi_{ref}+5\varphi)+\cos(10\pi f_1 t+5\varphi_{ref}-5\varphi)=5^{th} \text{ harmonic component (cancellation at fifth harmonic)} \quad (\text{Eq. 3})$$

According to the vector constellations, $\varphi_{ref}=0°/180°/90°/270°$, and $\varphi=45°$. Accordingly, out of the eight phases available at F1 frequency, three adjacent phases with 45° separation from each other have been selected, and they have been weighted as sqrt(2):1:1 for 0°, +45°, and −45° phases to constructively add at the fundamental frequency and cancel out at the $3^{rd}$ and $5^{th}$ harmonics. Continuing in this manner, the harmonics retained in the series comprising the following harmonics: $F_1$, $7*F_1$, $9*F_1$, $13*F_1$, $15*F_1$. Since the dominant $3^{rd}$ and $5^{th}$ order harmonics are removed due to phasor addition, the resultant waveform appears to be close to a sinusoidal waveform. A bandpass filtering further removes the unwanted out of band harmonics.

FIGS. 5A and 5B illustrate frequency domain of multiphase operation harmonic phasor cancellation, consistent with illustrative embodiments. In graph 500A, $\Phi_{11}$ represents a 0-degree phase; $\Phi_{21}$ represents a 135-degree phase; $\Phi_{31}$ represents a 225 degree phase. According to the phasor equation given above, with $\varphi=135$ degree and $\varphi_{ref}=0$ degrees, leading to the frequency components of $3*F_1$, $5*F_1$, $11*F_1$, and $13*F_1$. System 500A represents a logical and/or physical grouping of qubits such that they don't result in signal interference. For example, in the grouping of FIG. 5A, the grouping includes qubits related to the $3*F_1$, $5*F_1$, $11*F_1$, and $13*F_1$, where $F_1$ is a center frequency. Each pattern in the system 500A represents a different targeted frequency.

In some embodiments, filtering may be used to reject the higher harmonics. For example, the $11*F_1$ may be filtered out as denoted by the dotted lines. In contrast, FIG. 5B illustrates a second grouping comprising $F_1$, $7*F_1$, $9*F_1$, $15*F_1$, and $17*F_1$. In one embodiment, the targeted qubit frequency is $F_Q=F_2\pm n*F_1\pm F_D$, where $F_1=F_2/K$, $F_D=F_2/P$, where K and P are integers; $F_1$ is the first frequency, $F_2$ is the second frequency. Only a single frequency F2 of FIG. 4 is distributed on the chip to all the channels.

FIG. 6 illustrates a phasor chart 600 that explains the phasor cancellation and additions discussed above. Notably, the phase $\Phi_{21}$ of system 500A is immediately opposite to the phase $\Phi_{32}$ of system 500B. Similarly, phase $\Phi_{31}$ of system 500A is immediately opposite to the phase $\Phi_{22}$ of system 500B. Accordingly, by virtue of using a same phasor system (e.g., a collection of phasors, typically at the output of the divider or oscillator) to generate the different frequencies, different groupings can be implemented, which not only ultimately results in a substantial reduction of cross-talk between qubits, but reduces power in its implementation by virtue or using the same components to achieve different frequencies.

Figure 7:
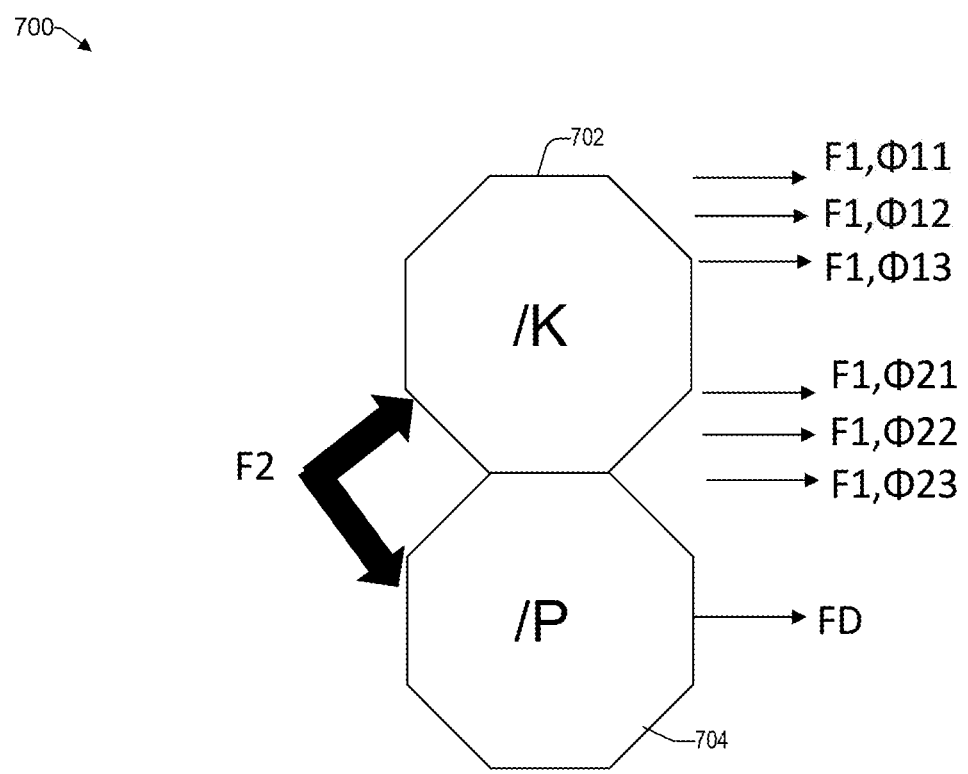
FIG. 7 is a conceptual block diagram of a multi clock generation architecture of a quantum controller, consistent with an illustrative embodiment.

Reference now is made to FIG. 7, which is a conceptual block diagram of a multi clock generation architecture 700 of a quantum controller, consistent with an illustrative embodiment. A single input frequency $F_2$ is used to generate a plurality of clock signals that can be used to excite corresponding qubits therewith. Architecture 700 includes a first frequency divider (/K) 702 configured to input the first frequency $F_2$ and generate a first set of plurality of phases at a second frequency (e.g., $F_1$, $\Phi_{11}$; $F_1$, $\Phi_{12}$; $F_1$, $\Phi_{13}$). In one embodiment, the waveforms have a duty cycle of 50%. There is a second frequency divider (/P) 704 configured to input the first frequency F2 and generate a second set of a plurality of phases at a second frequency (e.g. $F_1$, $\Phi_{21}$; $F_1$, $\Phi_{22}$; $F_1$, $\Phi_{23}$). FS represents the clock that is used for the DACS (e.g., DACS 302 and 322 of FIG. 3.)

In one embodiment, a qubit array comprises a plurality of clusters, each cluster being arranged to provide a maximum separation of resonance frequency to minimize cross talk between adjacent clusters. In this regard, reference is made to FIG. 8, which is a block diagram of an example frequency planning of qubits of an array of qubits based on their center frequency, consistent with an illustrative embodiment. This equally spaced, common centroid hexagonal arrangement provides an equal amount of physical separation between each qubit and its adjacent qubit. Each box in the arrangement 800 represents a qubit. Each box pattern represents a unique center frequency for qubits. A predetermined physical distance is maintained to minimize cross-talk between the different qubits. The distance between each qubit having a similar center frequency is maximized. In this way, deterministic cross-talk between one qubit to another is reduced.

In one embodiment, where the fabrication process is more controlled and the center frequencies can be configured, the center frequency can be set by the fabrication process itself. In other scenarios, where the fabrication process cannot predetermine the exact center frequency of the qubit, the grouping discussed herein is a logical (i.e., not a physical) grouping. For example, the determination of the center frequency is performed by providing a waveform of certain amplitude at a frequency and enabling the readout circuitry. The architecture of tuning the center frequency of a qubit includes a flux coupled arrangement, where an additional magnetic field is superimposed on the qubit under consideration.

Accordingly, the determined center frequency of qubits is used to group the qubits. More specifically, the center frequency of each qubit of a qubit array is determined and the qubit array is logically divided into different groups, where each group comprises a most diverse set of center frequencies of qubits.

The patterns of each box representing a qubit indicates the various center frequencies. In the embodiment where the fabrication process is more controlled and can accurately implement the center frequency, the qubits can be spatially arranged to provide a minimum interference to the adjacent and alternate adjacent qubits. Such physical arrangement improves the fidelity of computation. In this way, signals can be provided to each qubit with better fidelity and less interference. Accordingly, the qubit chip implements qubits in a spatial fashion to minimize cross-talk between qubits and to provide signal fidelity. The arrangements can follow uniform spatial placements of the qubit resonators. Each qubit is separated from its adjacent qubit by equal distance. For example, if qubit Qn is surrounded by a number of qubits QA, QB, QC, QD, and QE, the interference term between each pair of {Qn,Qx}, x=A,B,C,D,E remain the same. Hence, when the qubit Qn is active, it is sufficient to send only one cancellation term (e.g., a replica of the main signal). Accordingly, if the desired signal is Yqn, the cancellation term is given as α*Yqn. This term (signal=α*Yqn) is sent to each of the Qx, and is summed up with the respective Qx signal to cancel the x-talk effect arising from spatial interference of Qn.

Figure 8:
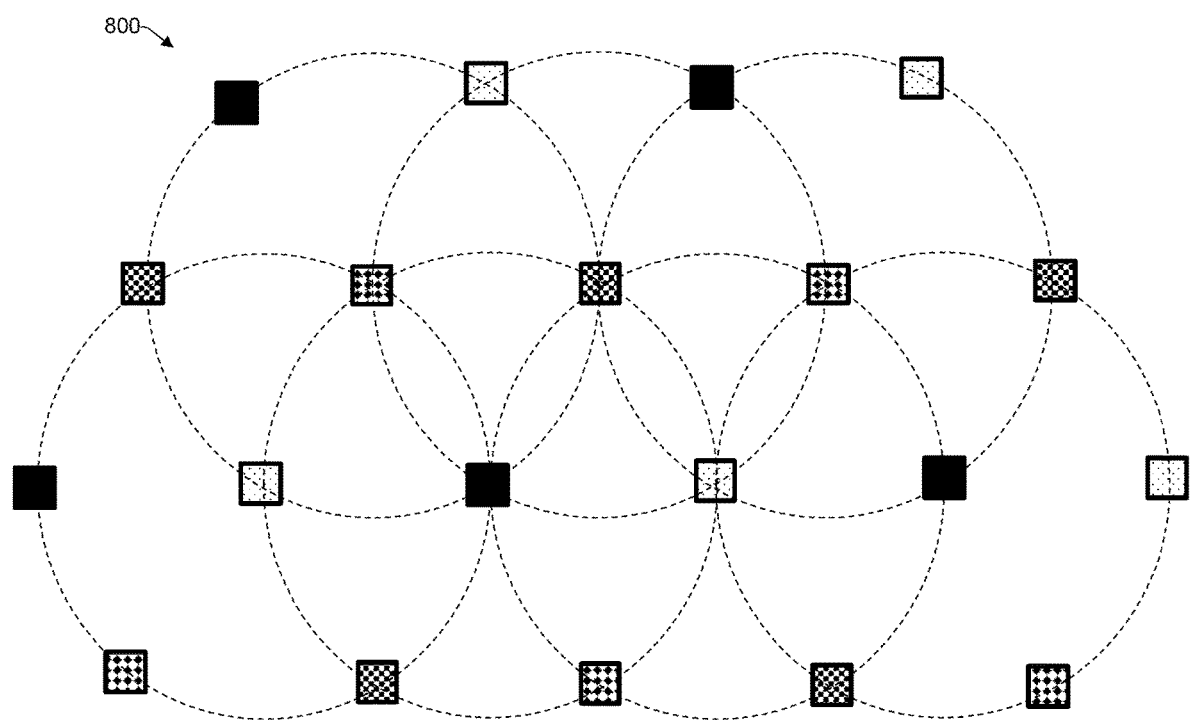
FIG. 8 is a block diagram of an example frequency planning of qubits of an array of qubits based on their center frequency, consistent with an illustrative embodiment.

In view of the circular placement contours for static reciprocal cancellation of FIG. 8, since the x-talk is a static component, such arrangement provides a deterministic signal coupling, which can be readily cancelled in the current domain. Another advantage of this arrangement relates to the fact that only one term is sufficient to cancel cross-talk throughout the array (since the spatial distance between any two box patterns is constant throughout the qubit array). Such arrangement facilitates cross-talk cancellation terms, which can be implemented in current mode to preserve linearity.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:
1. A quantum write controller, comprising:
   an in-phase path comprising:
      a first digital to analog converter (DAC) configured to receive an in-phase signal at a first frequency;
      a first mixer configured to mix an output of the first DAC with a second in phase frequency to create a third in phase frequency;
      a first combiner configured to combine an output of the first mixer with an output of a third mixer; and
      a second mixer configured to mix an output of the first combiner with a fourth in phase frequency;
   a quadrature path, comprising:
      a second DAC configured to receive a quadrature phase signal at the first frequency;

the third mixer configured to mix an output of the second DAC with a second quadrature frequency to create a third quadrature frequency;

a second combiner configured to combine the output of the third mixer with the output of the first mixer; and a fourth mixer configured to mix an output of the second combiner with a fourth quadrature frequency; and a third combiner configured to combine an output of the second mixer with an output of the fourth mixer.

2. The quantum write controller of claim 1, a matching network coupled to an output of the third combiner.

3. The quantum write controller of claim 2, wherein the matching network is configured to provide a maximum power transfer to a corresponding qubit.

4. The quantum write controller of claim 3, wherein the matching network is configured to filter out spurious signals introduced by at least one of the fourth in-phase frequency or the fourth quadrature frequency.

5. The quantum write controller of claim 1, wherein the first combiner is configured to sum the output of the first mixer and the output of the third mixer.

6. The quantum write controller of claim 5, wherein the second combiner is configured to subtract the output of the first mixer from the output of the third mixer.

7. The quantum write controller of claim 1, wherein the quantum write controller is configured to operate at a cryogenic temperature in a dilution refrigerator.

8. The quantum write controller of claim 1, wherein the first and second combiners are programmable.

9. The quantum write controller of claim 1, further comprising:
a first filter coupled between the output of the first combiner and an input of the second mixer; and
a second filter coupled between the output of the second combiner and an input of the fourth mixer.

10. The quantum write controller of claim 9, wherein the first and second filters are configured to remove spurious harmonic signals, introduced by the second in-phase frequency and the second quadrature frequency, which are away from a center frequency of a target qubit.

11. The quantum write controller of claim 1, wherein:
the quantum write controller is part of a quantum write controller array;
each quantum write controller is configured to control a single corresponding qubit; and
the first DAC and the second DAC are shared among a group of qubits based on having a same signal amplitude but different center frequency.

12. The quantum write controller of claim 11, wherein:
the first frequency is common in each quantum write controller in the quantum write controller array;
the third in-phase frequency is different in each quantum write controller in the quantum write controller array; and
the third quadrature frequency is different in each quantum write controller in the quantum write controller array.

13. The quantum write controller of claim 11, wherein:
the second in-phase frequency is common in each quantum write controller in the quantum write controller array;
the second quadrature frequency is common in each quantum write controller in the quantum write controller array;
the fourth in-phase frequency is common in each quantum write controller in the quantum write controller array; and
the fourth quadrature frequency is common in each quantum write controller in the quantum write controller array.

14. The quantum write controller of claim 1, wherein the second in-phase frequency and the second quadrature frequency, and the fourth in phase frequency and the fourth quadrature frequency, are related to each other by an integer multiplier N.

15. A method of controlling a qubit with a controller having an in-phase path and a quadrature path, the method comprising:
receiving an in-phase signal at a first frequency by a first digital to analog converter (DAC) in the in-phase path;
mixing an output of the first DAC with a second in phase frequency to create a third in phase frequency by a first mixer in the in-phase path;
combining an output of the first mixer with an output of a third mixer by a first combiner in the in-phase path;
mixing an output of the first combiner with a fourth in phase frequency by a second mixer;
receiving a quadrature phase signal at the first frequency by a second DAC in the quadrature path;
mixing an output of the second DAC with a second quadrature frequency to create a third quadrature frequency by the third mixer in the quadrature path;
combining the output of the third mixer with the output of the first mixer by a second combiner in the quadrature path;
mixing an output of the second combiner with a fourth quadrature frequency by a fourth mixer in the quadrature path; and
combining an output of the second mixer with an output of the fourth mixer by a third combiner.

16. The method of claim 15, providing a maximum power transfer to a corresponding qubit by coupling a matching network to an output of the third combiner.

17. The method of claim 15, wherein the matching network filters out spurious signals introduced by at least one of the fourth in-phase frequency or the fourth quadrature frequency, by coupling a matching network to an output of the third combiner.

18. The method of claim 15, wherein:
the first combiner sums the output of the first mixer and the output of the third mixer; and
the second combiner subtracts the output of the first mixer from the output of the third mixer.

19. The method of claim 15, further comprising:
coupling a first filter between the output of the first combiner and an input of the second mixer; and
coupling a second filter between the output of the second combiner and an input of the fourth mixer, wherein the first and second filters remove spurious harmonic signals introduced by the second in-phase frequency and the second quadrature frequency, which are away from a center frequency of the controlled qubit.

20. The method of claim 15, further comprising:
applying the first frequency to be common in each quantum write controller in a quantum write controller array;
applying the third in-phase frequency to be different in each quantum write controller in the quantum write controller array;

applying the third quadrature frequency to be different in each quantum write controller in the quantum write controller array;
applying the second in-phase frequency to be common in each quantum write controller in the quantum write controller array;
applying the second quadrature frequency to be common in each quantum write controller in the quantum write controller array;
applying the fourth in-phase frequency to be common in each quantum write controller in the quantum write controller array; and
applying the fourth quadrature frequency to be common in each quantum write controller in the quantum write controller array.

* * * * *